(12) United States Patent
Kang et al.

(10) Patent No.: US 9,583,511 B2
(45) Date of Patent: Feb. 28, 2017

(54) ARRAY SUBSTRATE HAVING INTEGRATED GATE DRIVER AND METHOD OF FABRICATING THE SAME

(71) Applicant: LG Display Co., Ltd., Seoul (KR)

(72) Inventors: In Kang, Daejeon (KR); Tae-Yong Jung, Gyeongsangbuk-do (KR); Tae-Keun Lee, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/584,918

(22) Filed: Dec. 29, 2014

(65) Prior Publication Data

US 2016/0035749 A1  Feb. 4, 2016

(30) Foreign Application Priority Data

Jul. 29, 2014 (KR) .................. 10-2014-0096727

(51) Int. Cl.
*H01L 27/12* (2006.01)
*H01L 29/66* (2006.01)
*H01L 29/786* (2006.01)

(52) U.S. Cl.
CPC ........ *H01L 27/124* (2013.01); *H01L 27/1248* (2013.01); *H01L 27/1259* (2013.01); *H01L 29/66765* (2013.01); *H01L 29/78669* (2013.01)

(58) Field of Classification Search
CPC ............... H01L 27/124; H01L 27/1248; H01L 29/78669; H01L 29/66765; H01L 27/1259
See application file for complete search history.

(56) References Cited

U.S. PATENT DOCUMENTS

2011/0210325 A1* 9/2011 Sakakura ............ H01L 27/1255
257/43
2013/0056736 A1* 3/2013 Kim ..................... G09G 3/3677
257/59
2015/0041814 A1* 2/2015 Kim ..................... H01L 27/124
257/59

FOREIGN PATENT DOCUMENTS

KR    10-2008-0103848 A    11/2008

OTHER PUBLICATIONS

Korean Intellectual Property Office, Office Action, Korean Patent Application No. 10-2014-0096727, Aug. 4, 2015, five pages [with concise relevance in English].

* cited by examiner

*Primary Examiner* — John P Dulka
*Assistant Examiner* — Charles R Peters
(74) *Attorney, Agent, or Firm* — Fenwick & West LLP

(57) ABSTRACT

An array substrate includes: a substrate; a gate connecting line on the substrate in a gate circuit area; a gate insulating layer on the gate connecting line; an active pattern on the gate insulating layer; a source connecting line and a pixel pattern sequentially disposed on the active pattern; an interlayer insulating layer and an organic pattern sequentially disposed on the gate insulating layer; a first passivation layer on the organic pattern; and a conductive pattern on the first passivation layer, the conductive pattern coupled to the gate connecting line and to the pixel pattern.

11 Claims, 6 Drawing Sheets

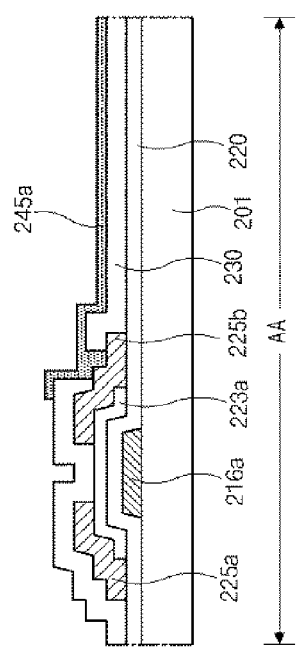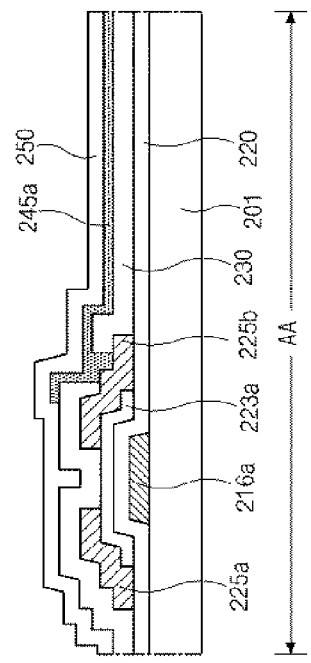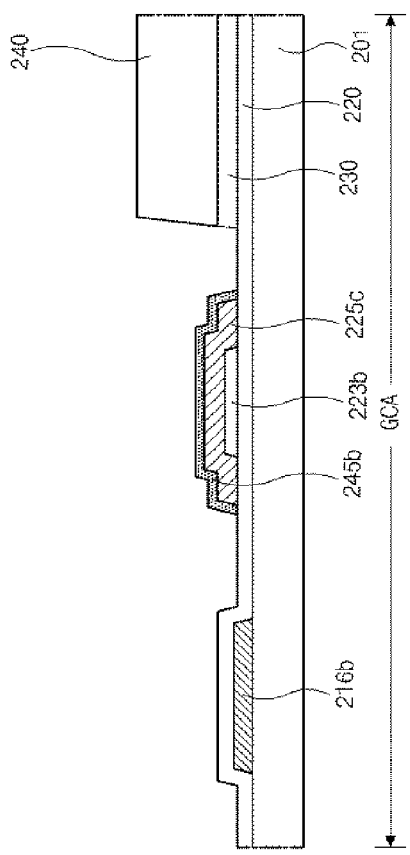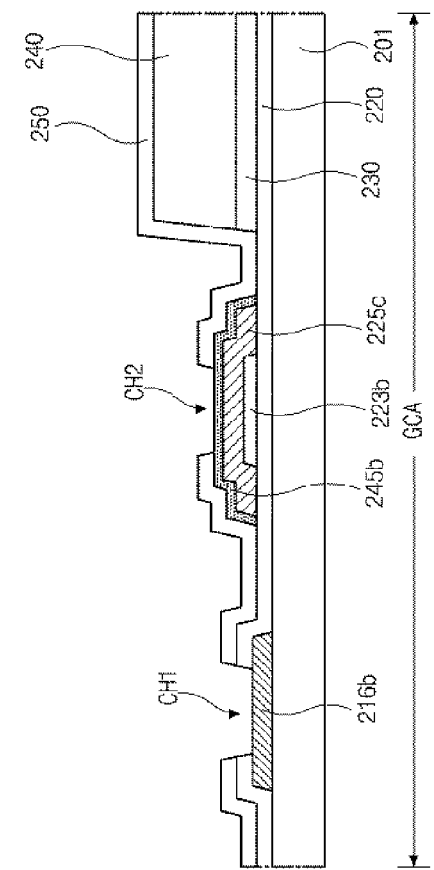
FIG. 5C
FIG. 5D

ARRAY SUBSTRATE HAVING INTEGRATED GATE DRIVER AND METHOD OF FABRICATING THE SAME

CROSS-REFERENCE TO RELATED APPLICATION

This application claims the benefit under 35 U.S.C. §119 (a) of Korean Patent Application No. 10-2014-0096727, filed on Jul. 29, 2014, in the Korean Intellectual Property Office, which is incorporated herein by reference in its entirety.

BACKGROUND

1. Technical Field

The present disclosure relates to an array substrate, and more particularly, to an array substrate having an integrated gate driver and a method of fabricating the same.

2. Discussion of the Related Art

Recently, liquid crystal display (LCD) devices have been in the spotlight as a next generation display device because the LCD device has high value added due to its low-power consumption and good portability.

The LCD device includes an array substrate where a plurality of thin film transistors (TFTs) are disposed, a color filter substrate and a liquid crystal layer between the array substrate and the color filter substrate. The LCD device displays an image using difference in refractive index according to optical anisotropy of the liquid crystal layer.

In recent years, an active-matrix LCD (AM-LCD) device where TFTs and pixel electrodes are arranged in matrix shapes has attracted much attention because of its high resolution and its high capability of embodying moving images.

Since amorphous silicon (a-Si) is formed through a low temperature process, an insulating substrate of a low cost may be adopted for amorphous silicon. As a result, the TFTs of the array substrate may be formed using amorphous silicon.

The LCD device includes a liquid crystal panel displaying an image, a backlight unit supplying a light to the liquid crystal panel and a driving unit supplying signals and power to the liquid crystal panel. The driving unit includes a printed circuit board (PCB). The PCB is classified into a gate PCB connected to a gate line of the liquid crystal panel and a data PCB connected to a data line of the liquid crystal panel. The gate PCB and the data PCB may be attached to a gate pad and a data pad, respectively, on the liquid crystal panel through a tape carrier package (TCP). The gate pad connected to the gate line is formed on an edge portion of the liquid crystal panel and the data pad connected to the data line is formed on another edge portion of the liquid crystal panel.

Since the driving unit includes the gate PCB and the data PCB attached to the gate pad and the data pad, respectively, a volume and a weight of the LCD device increase. To lessen the above drawbacks, a gate in panel (GIP) type LCD device where a gate driver is formed in the liquid crystal panel and a single PCB is attached to the liquid crystal panel has been suggested.

In the GIP type LCD device, the gate driver is formed together with the array substrate. In addition, the gate driver integrated in the array substrate includes a shift register and the shift register includes a plurality of stages connected in cascade.

FIG. 1 is a view showing an array substrate for a gate in panel type liquid crystal display device according to the related art.

In FIG. 1, an array substrate for a gate in panel (GIP) type liquid crystal display (LCD) device includes an active area AA and a gate circuit area GCA. A plurality of gate lines GL1 to GLn and a plurality of data lines DL1 to DLm are formed in the active area AA, and a gate driver is formed in the gate circuit area GCA. The gate driver includes a shift register and the shift register includes a plurality of stages ST1 to STn. The plurality of stages ST1 to STn correspond to the plurality of gate lines GL1 to GLn.

An output terminal of the present stage is connected to an input terminal of the next stage so that an output signal of the present stage can start operation of the next stage. In addition, the output terminal of each stage is connected to the gate line GL1 to GLn to supply the output signal to the active area AA. Accordingly, the output signal of each stage is supplied to the gate line GL1 to GLn and the next stage. Since the first stage ST1 does not have the previous stage, a start pulse SP is supplied to the first stage ST1 to start operation of the first stage ST1.

First and second clocks having a high level pulse are sequentially supplied to each stage through first and second clock lines CL1 and CL2 outside the gate driver. In addition, the output signals of the shift register are sequentially transmitted from the plurality of stages ST1 to STn to the plurality of gate lines GL1 to GLn.

Recently, it has been required to reduce a bezel area corresponding to a non-display region for a light weight and a thin profile with a slim design of the LCD device. In the GIP type LCD device according to the related art, since the plurality of clock lines are disposed outside the gate driver, there is a limit to obtain a narrow bezel.

SUMMARY

Embodiments of the present disclosure relate to an array substrate having an integrated gate driver and a method of fabricating the array substrate. Accordingly, one exemplary embodiment is directed to an array substrate that substantially obviates one or more of the problems due to limitations and disadvantages of the related art.

One exemplary embodiment is an array substrate having an integrated gate driver, where a narrow bezel is obtained, and a method of fabricating the array substrate.

In addition, one exemplary embodiment is an array substrate having an integrated gate driver, where moisture penetrating into the gate driver is blocked so that deterioration can be is prevented, and a method of fabricating the array substrate.

Advantages and features of the disclosure will be set forth in part in the description, which follows and in part will become apparent to those having ordinary skill in the art upon examination of the following or may be learned from practice of the disclosure. Other advantages and features of the embodiments herein may be realized and attained by the structure particularly pointed out in the written description and claims hereof as well as the appended drawings.

To achieve other advantages and features in accordance with the purpose according to one aspect of the disclosure, one exemplary embodiment is an array substrate including: a substrate including an active area and a gate circuit area; a gate connecting line on the substrate in the gate circuit area; a gate insulating layer on the gate connecting line; an active pattern on the gate insulating layer, the active pattern spaced apart from the gate connecting line; a source connecting line and a pixel pattern sequentially disposed on the active pattern; an interlayer insulating layer and an organic pattern sequentially disposed on the gate insulating layer, the interlayer insulating layer and the organic pattern spaced apart from the source connecting line; a first passivation layer on the organic pattern, the first passivation layer and the gate insulating layer having a first contact hole exposing the gate connecting line, and the first passivation layer having a second contact hole exposing the pixel pattern; and a conductive pattern on the first passivation layer, the conductive pattern connected to the gate connecting line through the first contact hole and connected to the pixel pattern through the second contact hole.

In another aspect, one exemplary embodiment is a method of fabricating an array substrate including: forming a gate connecting line on a substrate in a gate circuit area; forming a gate insulating layer on the gate connecting line; forming an active pattern on the gate insulating layer, the active pattern spaced apart from the gate connecting line; forming a source connecting line and a pixel pattern sequentially on the active pattern; forming an interlayer insulating layer and an organic pattern sequentially on the gate insulating layer, the interlayer insulating layer and the organic pattern spaced apart from the source connecting line; forming a first passivation layer on the organic pattern, the first passivation layer and the gate insulating layer having a first contact hole exposing the gate connecting line, and the first passivation layer having a second contact hole exposing the pixel pattern; and forming a conductive pattern on the first passivation layer, the conductive pattern connected to the gate connecting line through the first contact hole and connected to the pixel pattern through the second contact hole.

It is to be understood that both the foregoing general description and the following detailed description are exemplary and explanatory, and are intended to provide further explanation of the embodiments as claimed.

BRIEF DESCRIPTION OF THE DRAWINGS

The accompanying drawings, which are included to provide a further understanding of the disclosure, are incorporated in and constitute a part of this specification, illustrate implementations of the disclosure and together with the description serve to explain the principles of embodiments of the disclosure.

FIGS. 5A to 5F are cross-sectional views showing a method of fabricating an array substrate for a gate in panel type liquid crystal display device according to a second embodiment of the present disclosure.

DETAILED DESCRIPTION

Figure 1:
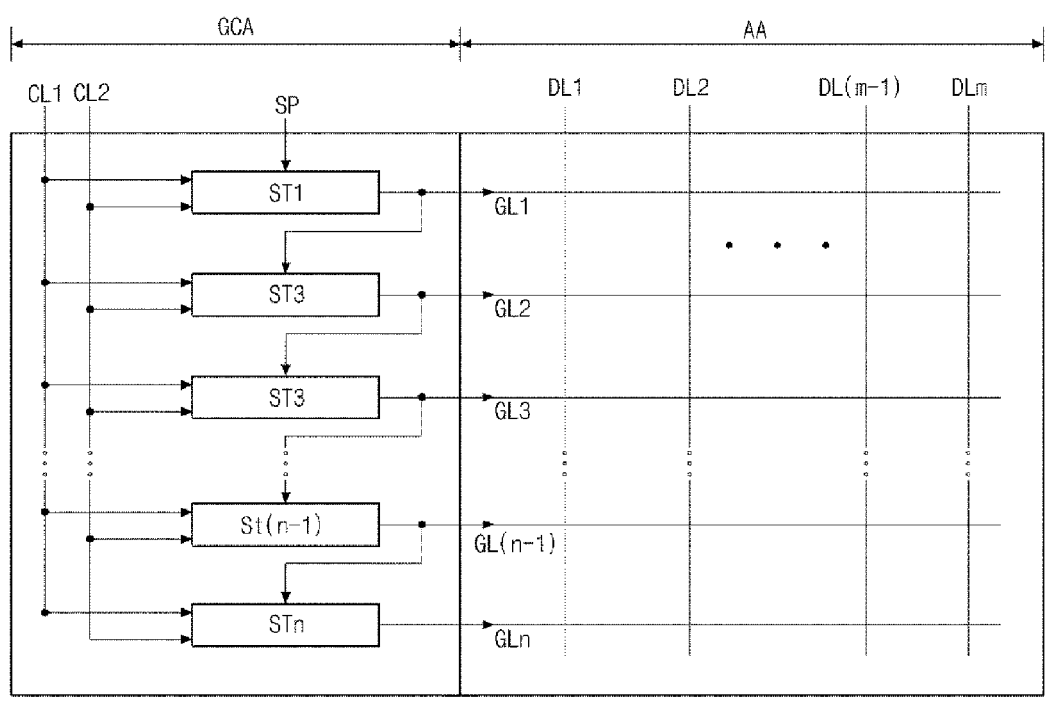
FIG. 1 is a view showing an array substrate for a gate in panel type liquid crystal display device according to the related art.

Reference will now be made in detail to embodiments of the present disclosure, examples of which are illustrated in the accompanying drawings. In the following description, when a detailed description of well-known functions or configurations related to this document is determined to unnecessarily cloud a gist of an embodiment of the disclosure, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

Figure 2:
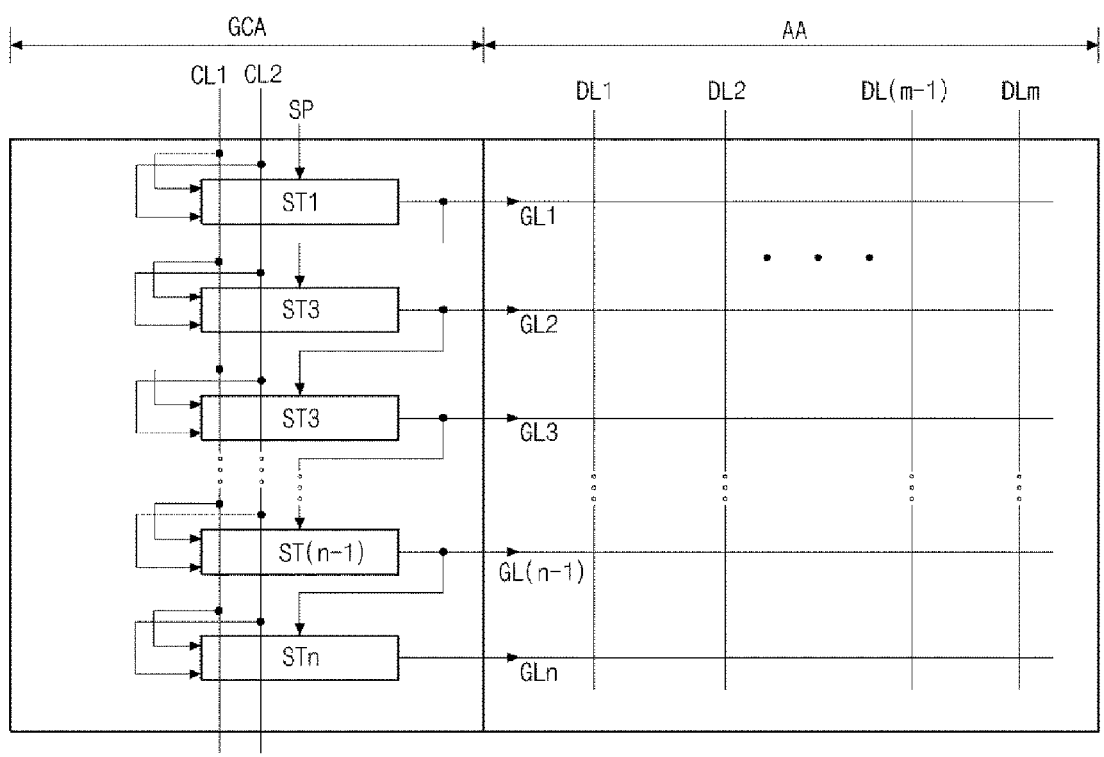
FIG. 2 is a view showing an array substrate for a gate in panel type liquid crystal display device according to a first embodiment of the present disclosure.

FIG. 2 is a view showing an array substrate for a gate in panel type liquid crystal display device according to a first embodiment of the present disclosure.

In FIG. 2, an array substrate includes an active area AA at a central portion thereof and a gate circuit area GCA at an edge portion thereof. A plurality of gate lines GL1 to GLn and a plurality of data lines DL1 to DLm are formed in the active area AA to display an image, and a gate driver is formed in the gate circuit area GCA to generate a plurality of gate signals. The plurality of gate lines GL1 to GLn cross the plurality of data lines DL1 to DLm to define a pixel region. The gate driver integrated in the array substrate includes a shift register and the shift register includes a plurality of stages ST1 to STn connected in cascade. Although not shown, each of the plurality of stages ST1 to STn may include a plurality of driving thin film transistors (TFTs) and the pixel regions may include a plurality of pixel TFTs. The plurality of driving TFTs and the plurality of pixel TFTs are formed at the same time. The plurality of stages ST1 to STn may correspond to the plurality of gate lines GL1 to GLn.

An output terminal of the present stage is connected to an input terminal of the next stage so that an output signal of the present stage can start operation of the next stage. In addition, the output terminal of each stage ST1 to STn is connected to the gate line GL1 to GLn to supply the output signal to the active area AA of the array substrate. Accordingly, the output signal of each stage ST1 to STn is supplied to the gate line GL1 to GLn and the next stage. Since the first stage ST1 does not have the previous stage, a start pulse SP is supplied to the first stage ST1 to start operation of the first stage ST1.

First and second clocks having a high level pulse are sequentially supplied to each stage through first and second clock lines CL1 and CL2 over the gate driver. Although the first and second clocks are inputted to each stage ST1 to STn in the first embodiment, three or more clocks may be inputted to each stage ST1 to STn in another embodiment. Accordingly, the output signals are sequentially transmitted from the plurality of stages ST1 to STn to the plurality of gate lines GL1 to GLn.

In the array substrate according to a first embodiment, since the plurality of clock lines CL1 and CL2 for transmitting the plurality of clock signals are formed over the gate driver, a bezel area of a non-display region is reduced as compared with the array substrate according to the related art where the plurality of clock lines are formed outside the gate driver. As a result, an LCD having a light weight and a thin profile with a slim design is obtained.

Figure 3:
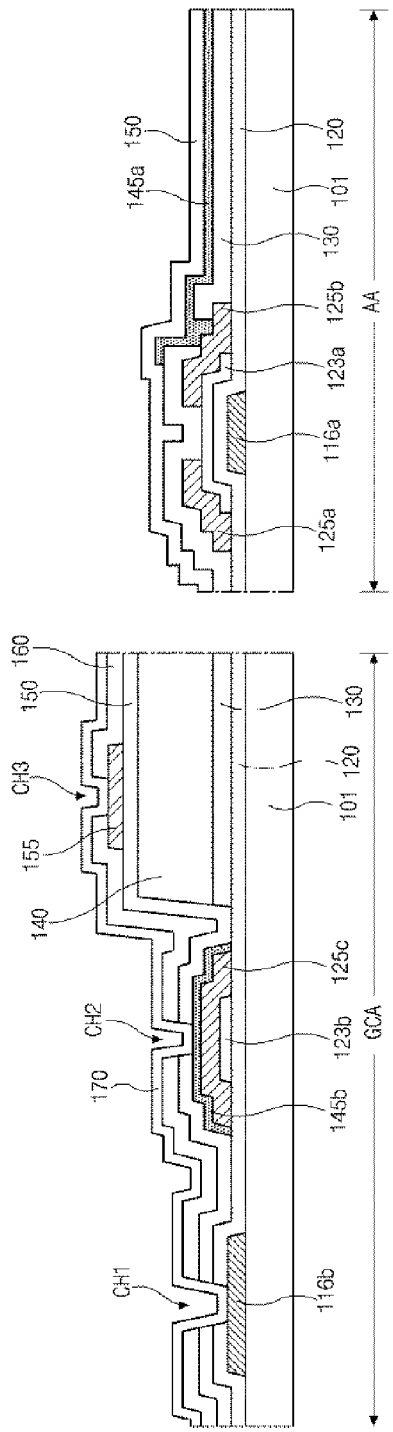
FIG. 3 is a cross-sectional view showing an array substrate for a gate in panel type liquid crystal display device according to a first embodiment of the present disclosure.

FIG. 3 is a cross-sectional view showing an array substrate for a gate in panel type liquid crystal display device according to a first embodiment of the present disclosure.

In FIG. 3, a substrate 101 includes an active area AA for displaying an image and a gate circuit area GCA for generating a plurality of gate signals. In the active area AA, a gate electrode 116a and a gate line connected to the gate electrode 116a are formed in each pixel region on the substrate 101, and a gate insulating layer 120 is formed on the gate electrode 116a and the gate line. An active layer 123a is formed on the gate insulating layer 120 over the gate electrode 116a, and source and drain electrodes 125a and 125b and a data line connected to the source electrode 125a are formed on the active layer 123a. The active layer 123a may be formed of intrinsic amorphous silicon (a-Si:H). The source and drain electrodes 125a and 125b are spaced apart from each other to correspond to both sides of the active layer 123a. The gate electrode 116a, the gate insulating layer 120, the active layer 123a, the source electrode 125a and the drain electrode 125b constitute the pixel TFT. An interlayer insulating layer 130 is formed in each pixel region on the source and drain electrodes 125a and 125b, and a pixel electrode 145a is formed on the interlayer insulating layer 130. The pixel electrode 145a may be formed of a transparent conductive material such as indium tin oxide (ITO) and indium zinc oxide (IZO). The interlayer insulating layer 130 has a drain contact hole exposing the drain electrode 125b, and the pixel electrode 145a is connected to the drain electrode 125b through the drain contact hole. A first passivation layer 150 is formed on the pixel electrode 145a.

In the gate circuit area GCA, a gate connecting line 116b is formed on the substrate 101, and the gate insulating layer 120 is formed on the gate connecting line 116b. The gate connecting line 116b may have the same layer and the same material as the gate electrode 116a. An active pattern 123b, a source connecting line 125c and a pixel pattern 145b are sequentially formed on the gate insulating layer 120. The active pattern 123b is spaced apart from the gate connecting line 116b. The active pattern 123b may have the same layer and the same material as the active layer 123a. The source connecting line 125c may have the same layer and the same material as the source and drain electrodes 125a and 125b. In addition, the pixel pattern 145b may have the same layer and the same material as the pixel electrode 145a. The source connecting line 125c and the pixel pattern 145b cover a top surface and a side surface of the active pattern 123b.

The interlayer insulating layer 130 is formed on the gate insulating layer 120 and an organic insulating pattern 140 is formed on the interlayer insulating layer 130. In addition, the first passivation layer 150 is formed on the organic insulating pattern 140. Although not shown, a gate driver including a shift register may be formed under the organic insulating pattern 140. The interlayer insulating layer 130 and the organic insulating pattern 140 have an opening exposing the source connecting line 125c, and the pixel pattern 145b is formed directly on the source connecting line 125c through the opening. The organic insulating pattern 140 may be formed of an organic insulating material such as photo acryl and benzocyclobutene (BCB). The interlayer insulating layer 130 and the organic insulating pattern 140 are spaced apart from the source connecting line 125b. A conductive pattern 155 is formed on the first passivation layer 150 over the organic insulating pattern 140, and a second passivation layer 160 is formed on the conductive pattern 155. The conductive pattern 155 may be formed of a metallic material such as aluminum (Al) and copper (Cu) to prevent a signal delay. Alternatively, the conductive pattern 155 may be formed of a transparent conductive material such as ITO and IZO. In addition, the conductive pattern 155 may be electrically separated from the gate driver due to the organic insulating pattern 140. A common layer 170 is formed on the second passivation layer 160. The common layer 170 may functions as a jumping line for connecting conducting lines of different layers such as the gate connecting line 116b, the pixel pattern 145b and the conductive pattern 155.

The gate insulating layer 120, the first passivation layer 150 and the second passivation layer 160 have a first contact hole CH1 exposing the gate connecting line 116b. In addition, the first passivation layer 150 and the second passivation layer 160 have a second contact hole CH2 exposing the pixel pattern 145b, and the second passivation layer 160 has a third contact hole CH3 exposing the conductive pattern 155. The common layer 170 is connected to the gate connecting line 116b through the first contact hole CH1, to the pixel pattern 145b through the second contact hole CH2 and to the conductive pattern 155 through the third contact hole CH3.

In the array substrate according to the first embodiment, the conductive pattern 155 may function as the plurality of clock lines CL1 and CL2 (of FIG. 2) and the plurality of clock signals are applied to the conductive pattern 155. Since the conductive pattern 155 is formed over the gate driver, an LCD device having a narrow bezel is obtained.

However, since the common layer 170 is formed as a top layer of the substrate 101 without a protecting layer, exterior moisture may penetrate into contact portions between the common layer 170 and the gate connecting line 116b, between the pixel pattern 145b and the source connecting line 125c and between the common layer 170 and the conductive pattern 155. For example, the exterior moisture may penetrate into the contact portions under high temperature and high humidity condition such as a temperature of about 60° C. and a humidity of about 90%. As a result, the contact portions may be deteriorated due to the moisture.

In addition, when the LCD device has an in-cell touch type where a plurality of touch scan lines and a plurality of touch sensing lines are formed on the array substrate, the conductive pattern 155 may function as the plurality of touch scan lines and a plurality of touch scan signals may be applied to the conductive pattern 155. In the in-cell touch type LCD device, the exterior moisture may cause deterioration of the contact portions.

To solve the above problems, a second embodiment is suggested.

Figure 4:
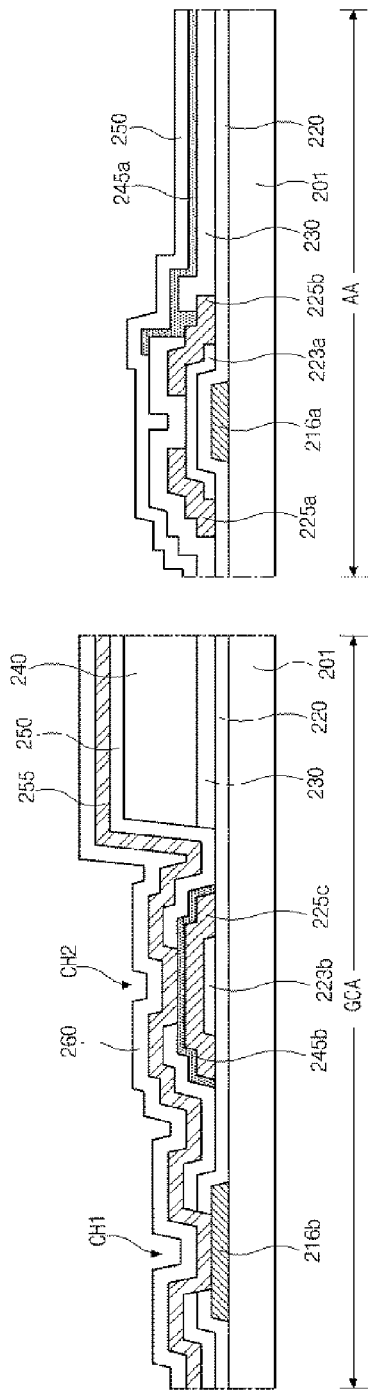
FIG. 4 is a cross-sectional view showing an array substrate for a gate in panel type liquid crystal display device according to a second embodiment of the present disclosure.

FIG. 4 is a cross-sectional view showing an array substrate for a gate in panel type liquid crystal display device according to a second embodiment of the present disclosure.

In FIG. 4, a substrate 201 includes an active area AA for displaying an image and a gate circuit area GCA for generating a plurality of gate signals. In the active area AA, a gate electrode 216a and a gate line connected to the gate electrode 216a are formed in each pixel region on the substrate 201, and a gate insulating layer 220 is formed on the gate electrode 216a and the gate line. An active layer 223a is formed on the gate insulating layer 220 over the gate electrode 216a, and source and drain electrodes 225a and 225b and a data line connected to the source electrode 225a are formed on the active layer 223a. The active layer 223a may be formed of intrinsic amorphous silicon (a-Si:H). The source and drain electrodes 225a and 225b are spaced apart from each other at opposite sides of the active layer 223a. The gate electrode 216a, the gate insulating layer 220, the active layer 223a, the source electrode 225a and the drain electrode 225b constitute the pixel TFT. An interlayer insulating layer 230 is formed in each pixel region on the source and drain electrodes 225a and 225b, and a pixel electrode 245a is formed on the interlayer insulating layer 230. The pixel electrode 245a may be formed of a transparent conductive material such as indium tin oxide (ITO) and indium zinc oxide (IZO). The interlayer insulating layer 230 has a drain contact hole exposing the drain electrode 225b, and the pixel electrode 245a is connected to the drain electrode 225b through the drain contact hole. A first passivation layer 250 is formed on the pixel electrode 245a.

In the gate circuit area GCA, a gate connecting line 216b is formed on the substrate 201, and the gate insulating layer 220 is formed on the gate connecting line 216b. The gate connecting line 216b may have the same layer and the same material as the gate electrode 216a. An active pattern 223b, a source connecting line 225c and a pixel pattern 245b are sequentially formed on the gate insulating layer 220. The active pattern 223b is spaced apart from the gate connecting line 216b. The active pattern 223b may have the same layer and the same material as the active layer 223a. The source connecting line 225c may have the same layer and the same material as the source and drain electrodes 225a and 225b. In addition, the pixel pattern 245b may have the same layer and the same material as the pixel electrode 245a. The source connecting line 225c and the pixel pattern 245b cover a top surface and a side surface of the active pattern 223b.

The interlayer insulating layer 230 is formed on the gate insulating layer 220 and an organic insulating pattern 240 is formed on the interlayer insulating layer 230. In addition, the first passivation layer 250 is formed on the organic insulating pattern 240. Although not shown, a gate driver including a shift register may be formed under the organic insulating pattern 240. The interlayer insulating layer 230 and the organic insulating pattern 240 have an opening exposing the source connecting line 225c, and the pixel pattern 245b is formed directly on the source connecting line 225c through the opening. The organic insulating pattern 240 may be formed of an organic insulating material such as photo acryl and benzocyclobutene (BCB). The interlayer insulating layer 230 and the organic insulating pattern 240 are spaced apart from the source connecting line 225b. A conductive pattern 255 is formed on the first passivation layer 250 over the organic insulating pattern 240, and a second passivation layer 260 is formed on the conductive pattern 255. The conductive pattern 255 may be formed of a metallic material such as aluminum (Al) and copper (Cu) to prevent a signal delay. Alternatively, the conductive pattern 255 may be formed of a transparent conductive material such as ITO and IZO. In addition, the conductive pattern 255 may be electrically separated from the gate driver due to the organic insulating pattern 240.

The gate insulating layer 220 and the first passivation layer 250 have a first contact hole CH1 exposing the gate connecting line 216b, and the first passivation layer 250 has a second contact hole CH2 exposing the pixel pattern 245b. The conductive pattern 255 is connected directly to the gate connecting line 216b through the first contact hole CH1 and directly to the pixel pattern 245b through the second contact hole CH2.

In the array substrate according to the second embodiment, the conductive pattern 255 may function as the plurality of clock lines CL1 and CL2 (of FIG. 2) and the plurality of clock signals are applied to the conductive pattern 255. In addition, the conductive pattern 255 may function as a jumping line for connecting conducting lines of different layers such as the gate connecting line 216b, the pixel pattern 245b and the conductive pattern 255. Since the conductive pattern 255 is formed over the gate driver, an LCD device having a narrow bezel is obtained.

Further, since the second passivation layer 260 is formed on the conductive pattern 255, exterior moisture may not penetrate into contact portions between the conductive pattern 255 and the gate connecting line 216b, between the pixel pattern 245b and the source connecting line 225c and between the conductive pattern 255 and the conductive pattern 255. For example, the exterior moisture may not penetrate into the contact portions even under high temperature and high humidity condition such as a temperature of about 60° C. and a humidity of about 90%. As a result, deterioration of the contact portions due to the moisture is reduced.

FIGS. 5A to 5F are cross-sectional views showing a method of fabricating an array substrate for a gate in panel type liquid crystal display device according to a second embodiment of the present disclosure.

Figure 5A:
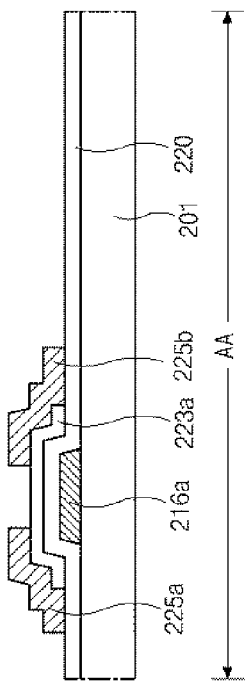
Figure 5A:
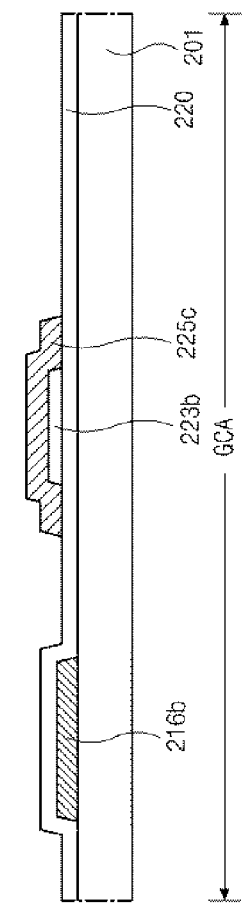

In FIG. 5A, a gate electrode 216a and a gate line connected to the gate electrode 216a are formed a substrate 201 in an active area AA on and a gate connecting line 216b is formed on the substrate 201 in a gate circuit area GCA by depositing and patterning a first metallic material through a photolithographic process. The first metallic material may include at least one of aluminum (Al), aluminum alloy, silver (Ag), silver alloy, molybdenum (Mo), molybdenum alloy, chromium (Cr), titanium (Ti) and tantalum (Ta). The gate electrode 216a, the gate line and the gate connecting line 216b may have a single-layered structure or a multiple-layered structure.

Next, a gate insulating layer 220 is formed on the gate electrode 216a, the gate line and the gate connecting line 216b by depositing a first insulating material. Next, an active layer 223a is formed on the gate insulating layer 220 in the active area AA and an active pattern 223b is formed on the gate insulating layer 220 in the gate circuit area GCA by depositing and patterning amorphous silicon through a photolithographic process. The active pattern 223b is spaced apart from the gate connecting line 216b.

Next, source and drain electrodes 225a and 225b are formed on the active layer 223a in the active area AA and a source connecting line 225c is formed on the gate insulating layer in the gate circuit area GCA by depositing and patterning a second metallic material through a photolithographic process. The source connecting line 225c wraps a top surface and a side surface of the active pattern 223b. The source and drain electrodes 225a and 225b are spaced apart from each other to correspond to both sides of the active layer 223a. The second metallic material may include at least one of aluminum (Al), aluminum alloy, silver (Ag), silver alloy, molybdenum (Mo), molybdenum alloy, chromium (Cr), titanium (Ti) and tantalum (Ta). The source electrode 225a, the drain electrode 225b and the source connecting line 225c may have a single-layered structure or a multiple-layered structure. The gate electrode 216a, the gate insulating layer 220, the active layer 223a, the source electrode 225a and the drain electrode 225b constitute a pixel TFT.

Figure 5B:
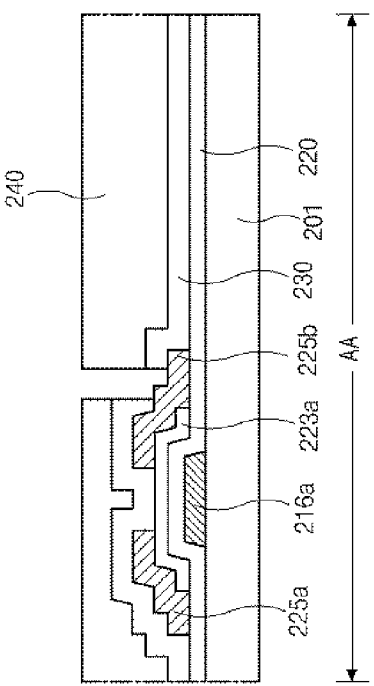
Figure 5B:
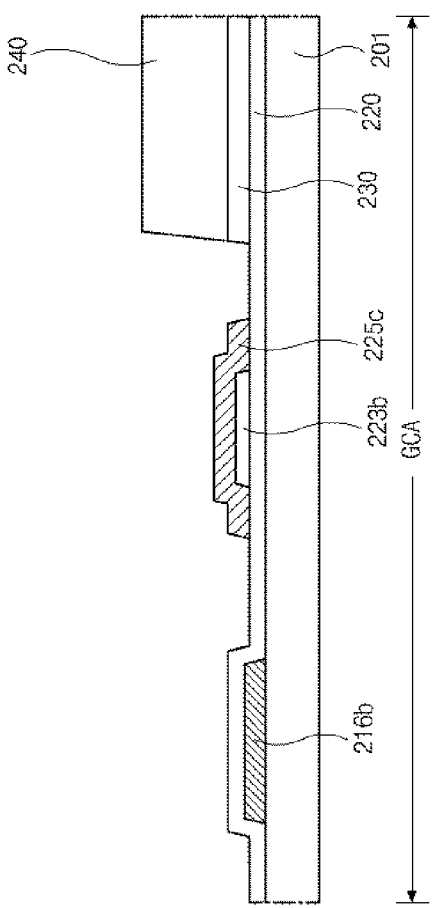

In FIG. 5B, an interlayer insulating layer 230 is formed on the TFT in the active area AA and the interlayer insulating layer 230 and an organic insulating pattern 240 are sequentially formed on the gate insulating layer 220 in the gate circuit area GCA by depositing and patterning an inorganic insulating material and an organic insulating material through a photolithographic process. The interlayer insulating layer 230 and the organic insulating pattern 240 have a drain contact hole exposing the drain electrode 225b in the active area AA, and the interlayer insulating layer 230 and the organic insulating pattern 240 have an opening exposing the source connecting line 225c in the gate circuit area GCA. The inorganic insulating material may include one of silicon nitride (SiNx) and silicon oxide (SiO$_2$), and the organic insulating material may include one of photo acryl and benzocyclobutene (BCB).

In FIG. 5C, after the organic insulating pattern 240 of the active area AA is removed, a pixel electrode 245a is formed on the interlayer insulating layer 230 in the active area AA and a pixel pattern 245b is formed on the source connecting line 225c by depositing and patterning a transparent conductive material through a photolithographic process. The pixel electrode 245a is connected to the drain electrode 225b through the drain contact hole, and the pixel pattern 245b wraps a top surface and a side surface of the source connecting line 225c through the opening. The transparent conductive material may include one of ITO and IZO.

In FIG. 5D, a first passivation layer 250 is formed on the pixel electrode 245a in the active area AA and on the pixel pattern 245b in the gate circuit area GCA by depositing and patterning a second insulating material through a photolithographic process. The gate insulating layer 220 and the first passivation layer 250 have a first contact hole CH1 exposing the gate connecting line 216b, and the first passivation layer 250 has a second contact hole CH2 exposing the pixel pattern 245b. The second insulating material may include one of an inorganic insulating material such as silicon nitride (SiNx) and silicon oxide (SiO$_2$) and an organic insulating material such as photo acryl and benzocyclobutene (BCB).

Figure 5E:
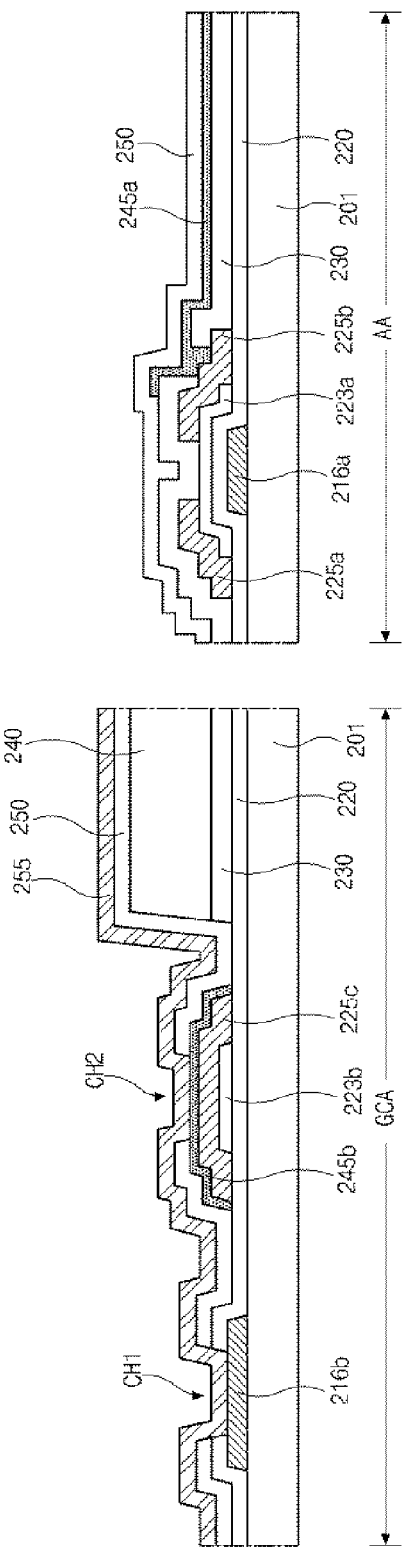

In FIG. 5E, a conductive pattern 255 is formed on the first passivation layer 250 in the gate circuit area GCA by depositing and patterning a third metallic material through a photolithographic process. The conductive pattern 255 is connected directly to the gate connecting line 216b through the first contact hole CH1 and directly to the pixel pattern 245b through the second contact hole CH2. The third metallic material may include one of a metallic material such as aluminum (Al) and copper (Cu) and a transparent conductive material such as ITO and IZO. Since the conductive pattern 255 functioning as a clock line and a jumping line is formed over the gate driver, an LCD device having a narrow bezel is obtained.

Figure 5F:
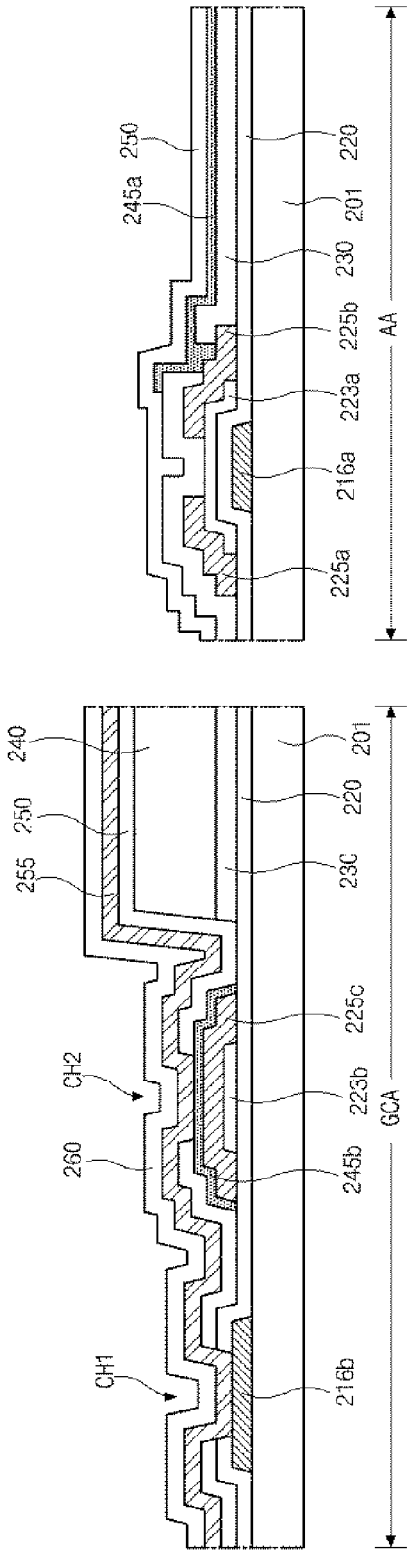

In FIG. 5F, a second passivation layer 260 is formed on the conductive pattern 255 in the gate circuit area GCA by depositing a third insulating material. The third insulating material may include one of an inorganic insulating material such as silicon nitride (SiNx) and silicon oxide (SiO$_2$) and an organic insulating material such as photo acryl and benzocyclobutene (BCB). Since the second passivation layer 260 is formed on the conductive pattern 255, exterior moisture may not penetrate into contact portions between the conductive pattern 255 and the gate connecting line 216b, between the pixel pattern 245b and the source connecting line 225c and between the conductive pattern 255 and the conductive pattern 255. For example, the exterior moisture may not penetrate into the contact portions even under high temperature and high humidity condition such as a temperature of about 60° C. and a humidity of about 90%. As a result, deterioration of the contact portions due to the moisture is reduced.

Consequently, in an array substrate having an integrated gate driver and a method of fabricating the array substrate according to the present disclosure, in which the conductive pattern 255 functioning as a clock line and a jumping line is formed over the gate driver, a liquid crystal display device having a narrow bezel is obtained. In addition, since the conductive pattern 255 is connected directly to the gate connecting line 216b and the pixel pattern 245b and the second passivation layer 260 is formed on the conductive pattern 255, moisture penetrating into the contact portions is blocked and deterioration due to the moisture is reduced.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. An array substrate comprising:
   a substrate including an active area and a gate circuit area;
   a gate connecting line on the substrate in the gate circuit area;
   a gate insulating layer on the gate connecting line;
   an active pattern on the gate insulating layer, the active pattern spaced apart from the gate connecting line;
   a source connecting line and a pixel pattern sequentially disposed on the active pattern, the source connecting line and the pixel pattern wrapping a top surface and a side surface of the active pattern;
   an interlayer insulating layer and an organic pattern sequentially disposed on the gate insulating layer, the interlayer insulating layer and the organic pattern spaced apart from the source connecting line;
   a first passivation layer on the organic pattern, the first passivation layer and the gate insulating layer having a first contact hole exposing the gate connecting line, and the first passivation layer having a second contact hole exposing the pixel pattern; and
   a conductive pattern on the first passivation layer, the conductive pattern coupled to the gate connecting line through the first contact hole and coupled to the pixel pattern through the second contact hole.

2. The array substrate of claim 1, further comprising a second passivation layer on the conductive pattern.

3. The array substrate of claim 1, wherein the conductive pattern includes one of a metallic material and a transparent conductive material.

4. The array substrate of claim 1, further comprising a shift register under the organic pattern.

5. The array substrate of claim 4, wherein the conductive pattern transmits a clock signal.

6. The array substrate of claim 1, further comprising:
   a gate electrode and a gate line connected to the gate electrode on the substrate in the active area, the gate electrode and the gate line covered with the gate insulating layer;
   an active layer on the gate insulating layer over the gate electrode;
   a source electrode and a drain electrode on the active layer, the source electrode connected to a data line, the source and drain electrodes covered by the interlayer insulating layer, and the interlayer insulating layer having a drain contact hole exposing the drain electrode; and
   a pixel electrode on the interlayer insulating layer, the pixel electrode connected to the drain electrode through the drain contact hole, and the pixel electrode covered by the first passivation layer.

7. The array substrate of claim 6, wherein the gate connecting line has a same layer and a same material as the gate electrode, wherein the active pattern has a same layer and a same material as the active layer, wherein the source connecting line has a same layer and a same material as the source and drain electrodes, and wherein the pixel pattern has a same layer and a same material as the pixel electrode.

8. A method of fabricating an array substrate, comprising:
   forming a gate connecting line on a substrate in a gate circuit area;
   forming a gate insulating layer on the gate connecting line;
   forming an active pattern on the gate insulating layer, the active pattern spaced apart from the gate connecting line;
   forming a source connecting line and a pixel pattern sequentially on the active pattern to wrap a top surface and a side surface of the active pattern;
   forming an interlayer insulating layer and an organic pattern sequentially on the gate insulating layer, the interlayer insulating layer and the organic pattern spaced apart from the source connecting line;
   forming a first passivation layer on the organic pattern, the first passivation layer and the gate insulating layer having a first contact hole exposing the gate connecting line, and the first passivation layer having a second contact hole exposing the pixel pattern; and
   forming a conductive pattern on the first passivation layer, the conductive pattern coupled to the gate connecting line through the first contact hole and coupled to the pixel pattern through the second contact hole.

9. The method of claim 8, further comprising forming a second passivation layer on the conductive pattern.

10. The method of claim 8, further comprising forming a shift register under the organic pattern.

11. The method of claim 8, further comprising:
    forming a gate electrode and a gate line connected to the gate electrode on the substrate in an active area, the gate electrode and the gate line covered with the gate insulating layer;
    forming an active layer on the gate insulating layer over the gate electrode;
    forming source and drain electrodes on the active layer, the source electrode connected to a data line, the source and drain electrodes covered by the interlayer insulating layer, and the interlayer insulating layer having a drain contact hole exposing the drain electrode; and
    forming a pixel electrode on the interlayer insulating layer, the pixel electrode connected to the drain electrode through the drain contact hole, and the pixel electrode covered by the first passivation layer.

* * * * *